US010023953B2

(12) United States Patent
Hogan et al.

(10) Patent No.: US 10,023,953 B2
(45) Date of Patent: Jul. 17, 2018

(54) HIGH PURITY REFRACTORY METAL POWDERS AND THEIR USE IN SPUTTERING TARGETS WHICH MAY HAVE RANDOM TEXTURE

(71) Applicant: H.C. Starck Inc., Newton, MA (US)

(72) Inventors: Patrick Hogan, Somerville, MA (US); Paul Aimone, Bridgewater, MA (US); Joseph Flanigan, Hudson, MA (US); Marcel Hagymasi, Goslar (DE); Helmut Haas, Boerssum OT Seinstedt (DE)

(73) Assignee: H.C. STARCK INC., Newton, MA (US)

( * ) Notice: Subject to any disclaimer, the term of this patent is extended or adjusted under 35 U.S.C. 154(b) by 505 days.

(21) Appl. No.: 14/681,660

(22) Filed: Apr. 8, 2015

(65) Prior Publication Data

US 2015/0292081 A1     Oct. 15, 2015

Related U.S. Application Data

(60) Provisional application No. 61/978,349, filed on Apr. 11, 2014, provisional application No. 61/978,341, filed on Apr. 11, 2014.

(51) Int. Cl.
C23C 14/34        (2006.01)
B22F 3/02         (2006.01)
(Continued)

(52) U.S. Cl.
CPC ........ C23C 14/3414 (2013.01); B22F 1/0014 (2013.01); B22F 3/02 (2013.01);
(Continued)

(58) Field of Classification Search
CPC ............... B22F 1/007; B22F 3/02; B22F 3/15
See application file for complete search history.

(56) References Cited

U.S. PATENT DOCUMENTS 5,119,729 A    6/1992 Nguyen
5,242,481 A    9/1993 Kumar
(Continued)

FOREIGN PATENT DOCUMENTS

CN    102513537 A    6/2012
EP     1137820 A1    6/2000
(Continued)

OTHER PUBLICATIONS

Second Written Opinion of the International Preliminary Examining Authority Application No. PCT/US2015/024928, dated Mar. 23, 2016.
(Continued)

Primary Examiner — Colleen P Dunn
Assistant Examiner — Nicholas A Wang
(74) Attorney, Agent, or Firm — Morgan, Lewis & Bockius LLP

(57) ABSTRACT

A method for making a sputtering target including steps of encapsulating and hot isostatically pressing at least one mass of metal powder (e.g., tantalum), having a particle size ranging from about 10 to about 1000 μm, with at least about 10 percent by weight of particles having a particle size greater than about 150 μm (for example, about 29 to about 56 percent (e.g., about 35 to about 47 percent) by weight of the particles in the at least one mass of metal powder having a particle size that is larger than 150 microns, but below about 250 μm), for defining at least a portion of a sputtering target body, having an essentially theoretical random and substantially uniform crystallographic texture.

8 Claims, 7 Drawing Sheets

(51) Int. Cl.
  *B22F 3/15* (2006.01)
  *C23C 14/14* (2006.01)
  *C22F 1/18* (2006.01)
  *H01J 37/34* (2006.01)
  *B22F 1/00* (2006.01)
  *B22F 3/12* (2006.01)
  *C22C 1/04* (2006.01)
  *B22F 3/10* (2006.01)

(52) U.S. Cl.
  CPC .............. *B22F 3/1208* (2013.01); *B22F 3/15* (2013.01); *C22C 1/045* (2013.01); *C22F 1/18* (2013.01); *C23C 14/14* (2013.01); *H01J 37/3426* (2013.01); *B22F 2003/1014* (2013.01)

(56) References Cited

U.S. PATENT DOCUMENTS

| | | | |
|---|---|---|---|
| 5,580,516 | A | 12/1996 | Kumar |
| 6,261,337 | B1 | 7/2001 | Kumar |
| 6,521,173 | B2 | 2/2003 | Kumar et al. |
| 6,589,311 | B1 | 7/2003 | Han et al. |
| 6,770,154 | B2 | 8/2004 | Koenigsmann |
| 7,081,148 | B2 | 7/2006 | Koenigsmann |
| 7,601,296 | B2 | 10/2009 | Michaluk et al. |
| 8,226,741 | B2 | 7/2012 | Shekhter et al. |
| 8,250,895 | B2 | 8/2012 | Bozkaya et al. |
| 2002/0041819 | A1 | 4/2002 | Kumar et al. |
| 2002/0112789 | A1 | 8/2002 | Jepson et al. |
| 2004/0016635 | A1 | 1/2004 | Ford et al. |
| 2004/0141870 | A1 | 7/2004 | Michaluk et al. |
| 2005/0223848 | A1 | 10/2005 | Ueno et al. |
| 2007/0243095 | A1 | 10/2007 | Ivanov |
| 2008/0078268 | A1 | 4/2008 | Shekhter et al. |
| 2008/0216602 | A1 | 9/2008 | Zimmermann et al. |
| 2008/0271779 | A1 | 11/2008 | Miller et al. |
| 2009/0038362 | A1 | 2/2009 | Jepson |
| 2013/0039796 | A1 | 2/2013 | L'Esperance et al. |

FOREIGN PATENT DOCUMENTS

| | | |
|---|---|---|
| EP | 1066899 A2 | 1/2001 |
| EP | 2017362 A1 | 1/2009 |
| EP | 2784173 A1 | 10/2014 |
| TW | 201011116 A1 | 3/2010 |
| WO | 2009/020587 A1 | 2/2009 |
| WO | 2009/151032 A1 | 12/2009 |
| WO | 2013/065362 A1 | 5/2013 |

OTHER PUBLICATIONS

International Preliminary Report on Patentability, Application No. PCT/US2015/024928, dated Aug. 18, 2016.

Search Report for Taiwan Patent Application, Application No. 104111728, dated Aug. 16, 2016.

International Search Report, Application No. PCT/US2015/024928, dated Jul. 16, 2015.

John H. Moll, 2000, "Utilization of Gas-Atomized Titanium and Titanium-Aluminide Powder," JOM, Springer New York LLC, vol. 52, No. 5, pp. 32-42 (May 1, 2000).

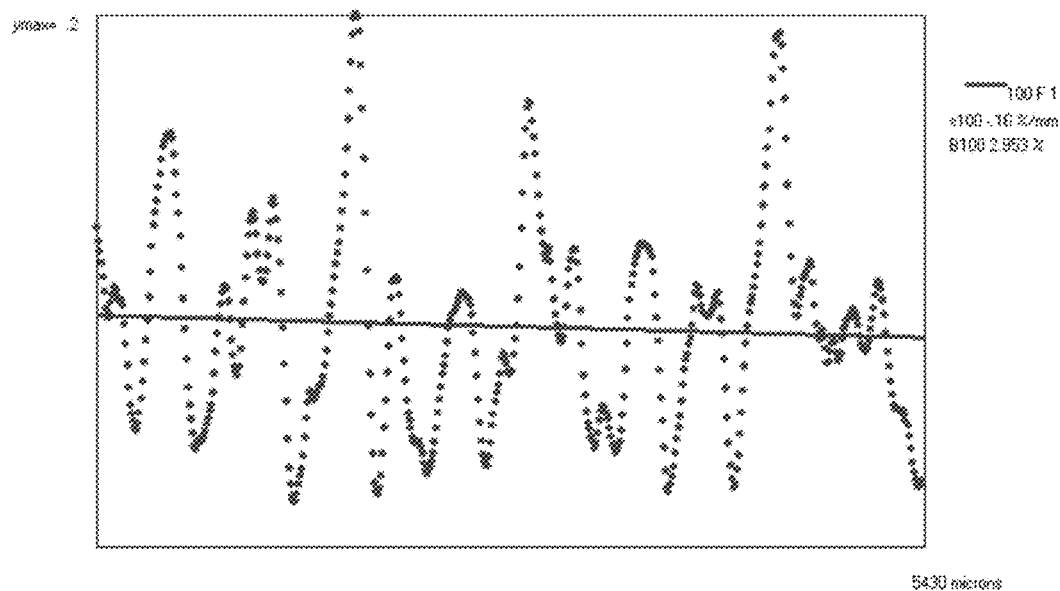
FIG. 2A1
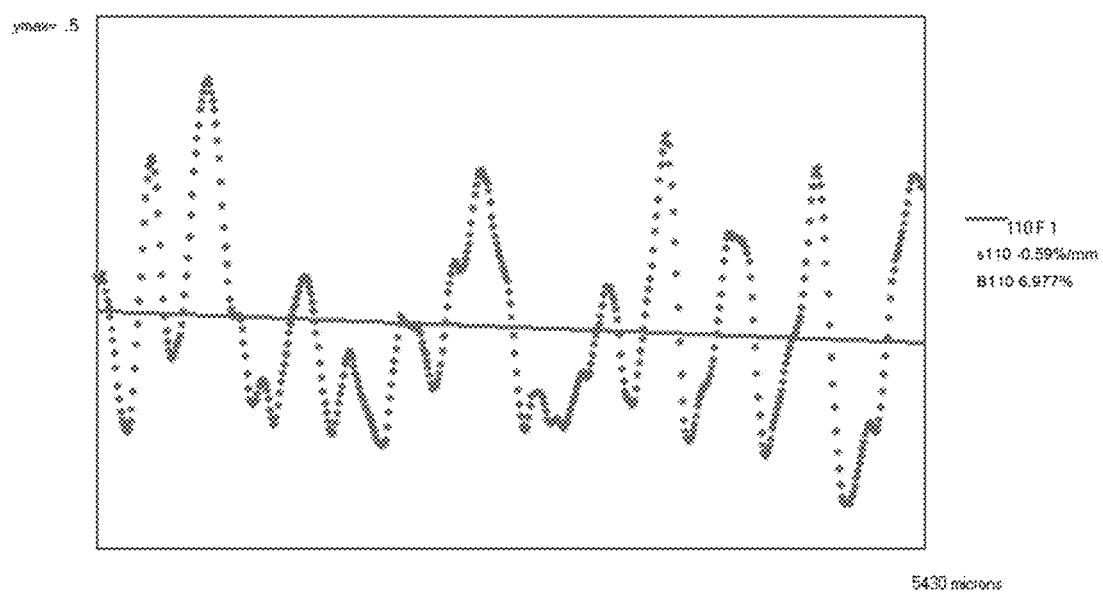
FIG. 2A2

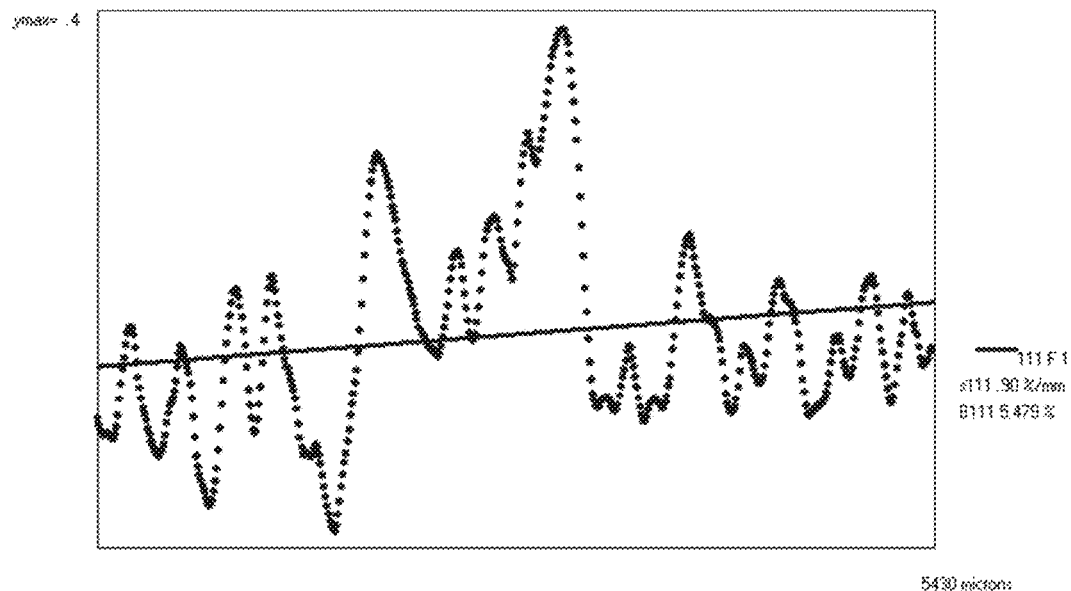
FIG. 2A3
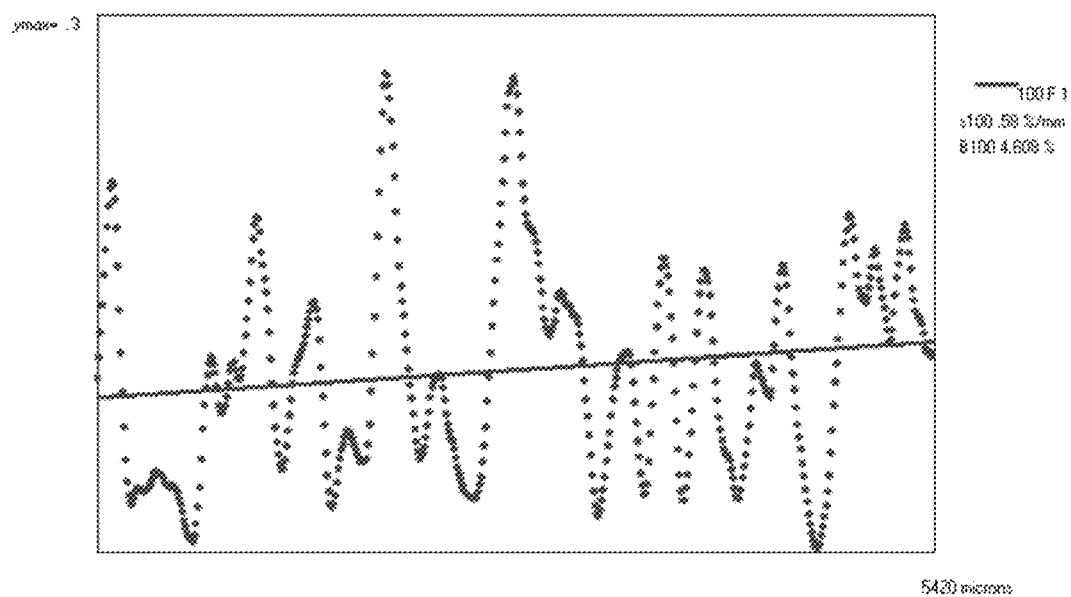
FIG. 2B1

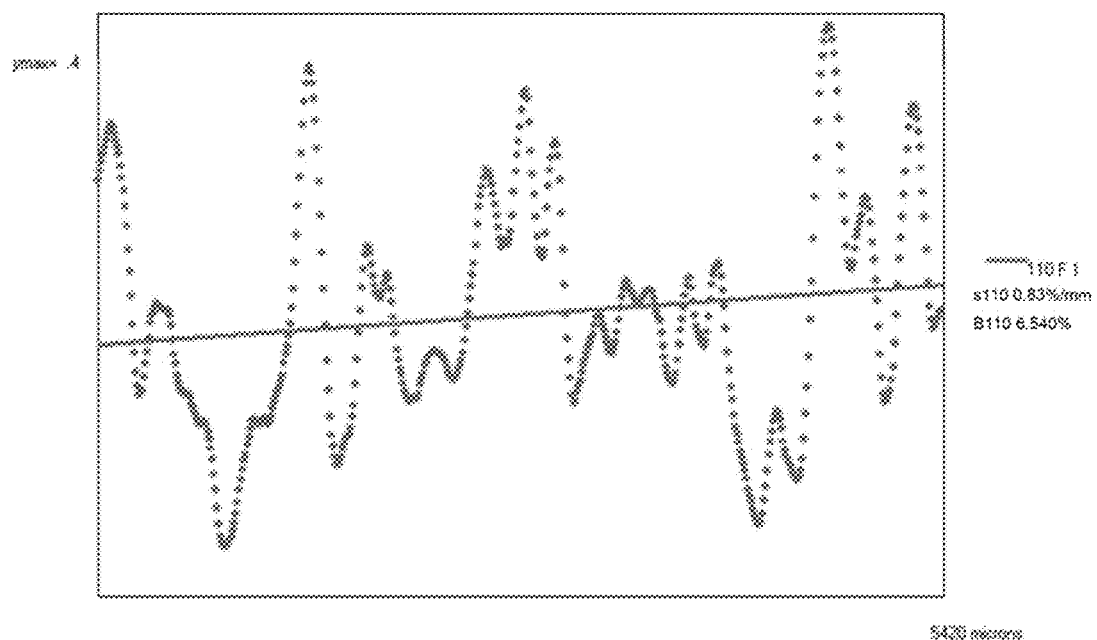
FIG. 2B2
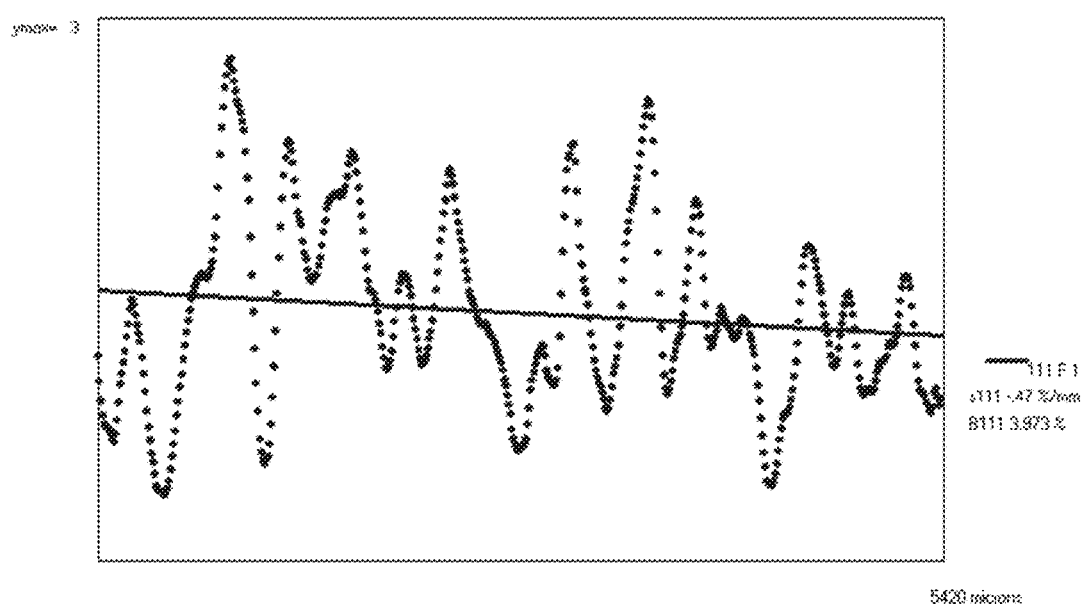
FIG. 2B3

HIGH PURITY REFRACTORY METAL POWDERS AND THEIR USE IN SPUTTERING TARGETS WHICH MAY HAVE RANDOM TEXTURE

CLAIM OF BENEFIT OF FILING DATE

The present application claims the benefit of the filing date of U.S. Application Ser. Nos. 61/978,341 and 61/978,349, both filed Apr. 11, 2014, the contents of which are expressly incorporated by reference.

FIELD

The present teachings relate generally to powdered metals, and more particularly to high purity refractory metal powders, their manufacture and use to produce sputtering targets, such as random texture sputtering targets.

BACKGROUND

Sputtering processes are employed to deposit thin films onto substrates to manufacture any of a variety of devices. Sputtering processes typically involve bombarding a solid sputtering target body with energized particles to eject atoms from the target body.

Sputtering targets may be made by ingot metallurgy, pursuant to which an ingot is formed (e.g., by electron beam melting of a metal), and thereafter thermomechanically processed for achieving a desired texture. Sputtering targets also may be made from powder metal starting materials, which are suitably consolidated to form a resulting target. When powder metals are used as starting materials it is typically desirable to employ high purity powders. For example, it is desired to employ powders that have a low content of undesired metallic impurities, and/or a low content of oxygen.

It has been recognized that sputtering target bodies having generally uniform crystallographic texture tend to enhance the ability to obtain uniformity in the resulting films.

There is an ongoing need for alternative sputtering targets, and particularly sputtering target bodies that exhibit a crystallographic texture that approximates theoretically "random crystallographic texture." As the skilled artisan would appreciate, a "random crystallographic texture" is a texture that is free of any preferred crystallographic orientation due to processing history (e.g., plastic deformation) over at least 95% of its volume (such as artifacts of a thermomechanical processing of a target body), such that distribution of grain orientations can be thus regarded as isotropic and occurring in a random statistical manner. There is especially a need for alternative tantalum-containing sputtering target bodies (such as target bodies prepared from powdered tantalum) that exhibit random crystallographic texture and that avoid the need for costly and energy intensive thermomechanical processing steps.

Examples of efforts to provide tantalum-containing sputtering targets are illustrated in one or more of U.S. Pat. Nos. 6,521,173; 6,261,337; 5,580,516; 7,601,296; 6,589,311; 6,770,154; 7,081,148; and published United States Patent Application 20090038362 (all of which are hereby expressly incorporated by reference). Also of potential relevance to the present teachings are published United States Patent Application Nos. 20040016635 and 20070243095, both incorporated by reference.

In U.S. Pat. Nos. 6,521,173 and 6,261,337, there is disclosed an approach for preparing powders having relatively low oxygen content. See also U.S. Pat. No. 8,226,741 and published U.S. Patent Application 20080078268 (incorporated by reference). Also disclosed are methods that contemplate consolidation by hot isostatic pressing of the powders. In published United States Patent Application No. 20090038362, which discusses U.S. Pat. No. 6,521,173 (see paragraph 12), there is disclosed an approach to controlling crystallographic texture by asymmetric rolling.

SUMMARY

The teachings herein are predicated upon the recognition that by the selection of appropriate starting materials, and by controlling processing conditions, it is possible to achieve a relatively high purity sputtering target, such as by producing and consolidating relatively high purity powder starting materials. Such sputtering target also, if processed consistent with aspects of the teachings herein, may exhibit substantially theoretical crystallographic texture expected for the material of the target. For instance, the crystallographic texture observed may be generally uniform throughout the entirety of the target, and particularly the target body portion of the target, namely the portion of the target that is subjected to bombardment during a sputtering operation. In one aspect, the teachings herein envision the manufacture and consolidation (e.g., to form a sputtering target) of high purity refractory metal powder. For example, the teachings envision processing to form a high purity refractory metal (e.g., tantalum) powder, wherein the powder may be 99.5, 99.95, or even 99.995 percent by weight pure, and may have an oxygen content below about 150 ppm (e.g., from about 10 to about 125 ppm) and a content of a scavenging metal (i.e., a metal having a higher affinity for oxygen than the refractory metal in the processing conditions specified, examples of which may include one or more alkaline earth metals such as magnesium or calcium, silicon, aluminum, or any combination thereof) that is below about 15 ppm (e.g., about 0.5 to about 10 ppm).

A sputtering target body in accordance with the present teachings may be prepared by consolidating the powders of the present teachings. Consolidating may be by one or any combination of sintering, hot isostatic pressing, hot extruding, or otherwise. One or more steps of compacting may be employed as well, such as die compacting and/or cold isostatic pressing to a suitable density (e.g., about 82 to about 88% of theoretical). Spraying, such as by cold spraying in accordance with teachings of U.S. Pat. No. 8,226,741 and/or published United States Patent Application No. 20080078268 (both incorporated by reference), may also be employed. The target body may have a density of at least about 0.92, 0.95 or even 0.98 times the theoretical density of the overall material per ASTM 8311-08. For one illustrative target body that consists essentially of tantalum, the target body may have a density in the range of at least about 15.4 to about 16.7 $g/cm^3$, more specifically about 15.9 to about 16.7 $g/cm^3$, and still more specifically about 16.4 to about 16.7 $g/cm^3$. The sputtering target body may also be sufficiently strong so that it withstands, without fracture, routine stresses encountered during subsequent assembly operations (e.g., a three point straightening assembly operation, a creep flattening operation, or some other operation during which the target body is subjected to application of a stress).

In general, the present teachings meet one or more of the above needs by providing a method for making powders, as well as a method for processing powders for forming a sputtering target.

As to the method for making powders, the present teachings contemplate among its various aspects a method for making a refractory metal powder comprising the steps of: locating a mass of refractory metal powder having an initial content of oxygen in a reactor; locating within the reactor, spaced apart from the mass of refractory metal powder, a mass of a scavenging metal (namely, a metal having a higher affinity for oxygen than the refractory metal powder under the processing conditions, desirably so that the scavenging metal preferentially forms an oxide with oxygen in the reactor rather than the refractory metal powder, which can thereafter be separated from the mass of powder from the reactor), wherein the mass of the scavenging metal and the mass of the refractory metal are not blended together (e.g., there is no scavenging metal in the mass of the refractory metal); heating within the reactor to a scavenging temperature for causing at least a portion of the scavenging metal to at least partially vaporize and react with at least a portion of the initial content of oxygen for forming a scavenging metal oxide with the scavenging metal; and separating the scavenging metal oxide from the mass of refractory metal powder so that a resulting mass of refractory metal powder is formed that has a resulting content of oxygen that is less than the initial content of oxygen.

As the following will illustrate the refractory metal powder may comprise at least about 99.5, 99.95, or even about 99.995 percent by weight of the refractory metal (e.g., tantalum). The initial content of oxygen may be greater than about 300 ppm by weight, and through the use of the method it may be reduced by more than half its initial content, or even more than 75 percent of its initial content. The mass of refractory metal powder may be in the form of a bed having a depth ranging from about 0.3 cm to about 3.5 cm (e.g., about 0.5 cm to about 2.5 cm).

The scavenging metal may be magnesium or another alkaline earth metal. The scavenging metal may be present in the reactor in the form of flakes. The heating step may include heating at a temperature of about 800 to about 1000° C. The resulting oxygen content in the resulting mass of refractory metal powder is in the range of about 10 to about 125 ppm and/or the resulting scavenging metal is present in the amount of about 0.5 to about 10 ppm. One or more passivation operations may be employed for controllably introducing oxygen into a reactor, such as for forming a thin oxide layer on resulting tantalum powder.

As for the manufacture of targets, there is contemplated a method including consolidating the powder made in accordance with the present teachings. For example, in one aspect such a method may include steps of encapsulating at least one mass of refractory metal (e.g., tantalum) powder having a particle size ranging from about 45 to about 250 μm, with about 29 to about 56 percent (e.g., about 35 to about 47 percent) by weight of the particles in the at least one mass of metal powder having a particle size that is larger than 150 microns, but below about 250 μm (and optionally having a content below about 10 ppm of any metallic element (e.g., one or more alkaline earth metals such as magnesium or calcium, silicon, aluminum, or any combination thereof) having a higher affinity for oxygen than a major metal (i.e., the metal present in the largest amount by weight) of the powder) in a container or other suitable apparatus configured for defining at least a portion of a sputtering target body. The at least one mass of refractory metal powder is consolidated (e.g., hot isostatically pressed, hot pressed, sintered, or otherwise consolidated) to form a densified mass having an initial crystallographic texture (specifically, an initial crystallographic texture immediately following being hot isostatically pressed and removed from the container, or otherwise being consolidated), while the at least one mass of refractory metal powder is in the container or other suitable apparatus, wherein the hot isostatically pressing or other consolidating step is performed under conditions so that the initial crystallographic texture achieved in the densified mass approximates a theoretical random and uniform crystallographic texture, wherein the method is devoid of any step of altering (e.g., by thermomechanical processing) the initial crystallographic texture substantially throughout the resulting densified mass (e.g., across at least about 50%, 70% or even 90% by weight of the resulting densified mass) after the step of hot isostatically pressing and prior to sputtering. Thus, the initial crystallographic texture obtained immediately following being consolidated (e.g., hot isostatically pressed, hot pressed, sintered, or otherwise consolidated) and removed from the container (and steps such as cleaning, surface finishing and/or mounting to a backing plate) is the final texture of the resulting sputtering target.

In particular aspects, the present teachings meet one or more of the above needs by providing a method for making a sputtering target, including providing a powder (e.g., of tantalum, or other refractory metal, having a purity of at least about 99.5%, more preferably at least about 99.95%, and still more preferably at least about 99.995%) having an oxygen content below about 75 ppm (e.g., below about 60 ppm or even below about 50 ppm), and/or having a maximum magnesium content below about 10 ppm (or even 5 ppm). The powder may have a particle size that is below about 1000 μm, about 850 μm, about 650 μm, about 500 μm, about 350 μm or even about 250 μm (e.g., no particles in the powder exceed about 1000 μm, about 850 μm, about 650 μm, about 500 μm, about 350 μm, or even about 250 μm). For instance, about 95 percent, about 85 percent, about 75 percent by weight of the total particles may have a particle size that is at least about 10 μm, at least about 40 μm, at least about 65 μm or at least about 90 μm. About 95 percent, about 85 percent, about 75 percent by weight of the total particles may have a particle size that is below about 1000 μm, below about 850 μm, below about 650 μm, below about 500 μm, below about 350 μm or below about 250 μm.

About 25 to about 65 percent (e.g., about 29 to about 56 percent or even about 35 to about 47 percent) by weight of the particles in the at least one mass of metal powder may have a particle size that is larger than about 65 μm, about 150 μm, about 250 μm, about 500 μm, about 650 μm or about 850 μm, but below about 1000 μm. It has been surprisingly found that the use of at least about 10, 20, 30, 40 or even 50 percent by weight of particles having a particle size greater than about 150 μm results in an effectively consolidated mass (e.g., as a result of hot isostatic pressing).

About 25 to about 65 percent (e.g., about 29 to about 56 percent or even about 35 to about 47 percent) by weight of the particles in the at least one mass of metal powder may have a particle size that is below about 1000 μm, 850 μm, 650 μm, about 500 μm, about 350 μm, or about 250 μm, but above about 10 μm.

By way of one illustrative example, the powders may be employed in at least one mass and may have at least about 95% by weight of particles exhibiting a particle size from about 45 to about 250 μm (for instance, about 29 to about 56 percent (e.g., about 35 to about 47 percent) by weight of the particles in the at least one mass of metal powder may have a particle size that is larger than about 150 microns but below about 250 microns).

The powder may be isostatically pressed to define a target body at a temperature that is at or below about 1400° C., about 1325° C., or about 1250° C. It is possible that pressing may be at lower temperatures (e.g., below about 1100° C. (e.g., less than about 1080° C. or even less than about 1000° C.)). Pressing may be at a pressure in the range of about 100 to about 300 MPa, (e.g., about 170 MPa to about 250 MPa).

By way of illustration, it is contemplated having a particle size for the refractory metal (e.g., tantalum) powder ranging from about 10 to about 1000 µm, with at least about 10, 20, 30, 40 or 50 percent by weight of particles having a particle size greater than about 150 µm (for example, about 29 to about 56 percent (e.g., about 35 to about 47 percent) by weight of the particles in the at least one mass of metal powder having a particle size that is larger than 150 microns, but below about 250 µm).

Pressing or another mode of consolidating may also be done under such conditions for a period of time sufficient to obtain a crystallographic texture (as measured by electron backscatter detection ("EBSD"), as described herein, for analyzing grains having a major direction (e.g., axis) falling within 15 degrees)(°) of normal to the surface of the analyzed body) having about 5 to about 15% (e.g., about 7 to about 13%, such as about 9 to about 11%) by volume <100>, about 15 to about 30% (e.g., about 17 to about 26%, such as about 20 to about 23%) by volume <110> and about 10 to about 25% (e.g., about 11 to about 20%, such as about 13 to about 16%) by volume <111>. Desirably, the ratio of crystallographic textures by volume of <100>, <110> and <111> throughout the resulting sputtering target body ranges from about 5-15:15-30:10-25 (e.g., about 7-13:17-26:11-20; such as about 9-11:20-23:13-16). To this end, desirably the ratio of crystallographic textures by volume of <100>, <110> and <111> throughout the resulting sputtering target body ranges from about 1:2:1.4. Resulting grains are generally uniformly distributed throughout the resulting target body and have a grain size ranging from about 15 to about 500, about 350, about 250, or about 150 µm throughout the target (e.g., at least throughout the portion of the target that is subjected to bombardment for sputtering). Desirably the grain size will average throughout the target body in the range of about 30 to about 145 µm, more preferably about 35 to about 135 µm, and still more preferably about 40 to about 125 µm (e.g., about 40 to about 100 µm, or about 50 to about 80 µm), or even about 55 to about 115 µm, about 65 to about 105 µm, or about 75 to about 100 µm. It is thus possible that the average grain size may be in excess of about 65 µm (e.g., it may be about 70 µm, about 80 µm, about 90 µm, or even about 100 µm). The resulting crystallographic texture and/or grain size is achieved and the method of the teachings herein may be performed in the absence of altering the crystallographic texture throughout the resulting target body after the step of consolidating (e.g., hot isostatically pressing, hot pressing, sintering, or otherwise) and prior to sputtering. Thus, the resulting crystallographic texture and/or grain size may be achieved free of (i) any thermomechanical processing step subsequent to consolidation for altering crystallographic texture (e.g., throughout the resulting target body); (ii) any heat treating step for altering crystallographic texture (e.g., throughout the resulting target body) or both (i) and (ii).

In another aspect of the teachings herein, there is contemplated a sputtering target that is made according to the method of the present teachings. There is also contemplated a sputtering target body (e.g., a tantalum sputtering target body) having a generally uniform crystallographic texture throughout the target body. For instance, the target body may be substantially devoid of crystallographic textural banding (i.e., it has a banding factor below about 7% for the <100> and <111> orientations, and/or may have a banding factor below about 10% for <110> orientations, or even about 7% or less) and the target body may be substantially devoid of crystallographic texture gradients (i.e., it has an average through-thickness gradient that has an absolute value below about 6%/millimeter ("mm") for the <100> and <111> orientations and/or the <110> orientations; for example, it may have an average through-thickness gradient that has an absolute value below about 5%/mm, 4%/mm, 3%/mm, 2%/mm or even 1%/mm). The ratio of crystallographic textures by volume of <100>, <110> and <111> throughout the resulting sputtering target body may be about 1:2:1.4.

Surprisingly, the teachings herein allow for the formation of target bodies of relatively high thicknesses as compared with past targets. For example, target bodies may be as thin as about 1 cm, about 0.5 cm or about 0.25 cm. However, it is possible that the target bodies may be at least about 1.5 cm thick. For example, the target bodies may be at least about 2 cm, 3 cm, 4 cm or even 5 cm in thickness (e.g. they may be in the range of about 2.5 to about 5 cm thick). They may also have a larger thickness (e.g., about 5 to about 20 cm thick or larger).

Further, by virtue of the textures achievable, the teaching herein also afford a technical benefit of enabling target bodies to be sputtered to depths that are substantially the entire thickness of the target body (e.g., to a depth that is at least 80%, 90%, or even 95% the thickness of the target body). Thus the teachings herein also contemplate a method of sputtering using the targets of the teachings in which sputtering is performed to a depth of at least 80%, 90%, or even 95% the thickness of the target body. Further, by virtue of the textures achievable, the teachings herein also afford a technical benefit of enabling target bodies to avoid exhibiting through thickness texture variations that could result in significantly different (e.g., greater than about 20%) average sputtering rates as among sputtering locations at different depths of the target. Particle generation and/or other adverse conditions that could prematurely shorten the life of a sputtering target may also be avoided by the present teachings.

In yet another aspect of the teachings herein, it is contemplated that sputtering is performed using a sputtering target body in accordance with the present teachings. It also is contemplated that thin films result that are used in any of a number of electronic components or devices (e.g., as a layer, such as a barrier layer, an electrode layer, as part of a semiconductor, as part of an integrated circuit, or otherwise), such as one or more of a television, a video display, a smartphone, a tablet computer, a personal digital assistant, a navigation device, a sensor, a portable entertainment device (e.g., video players, music players, etc.), or even a photovoltaic device. It is envisioned that sputtering targets in accordance with the present teachings are sized and dimensioned so that they may be employed for sputtering a thin film of material having a generally uniform thickness onto a wafer or other substrate having a diameter (or other dimension) of at least about 200 mm, about 300 mm, or even at least about 450 mm. This is believed possible, at least in part, due to the surprising ability to consolidate a mass of metal powder such as a refractory metal powder (e.g., to hot isostatically press a mass of metal powder such as refractory metal powder) to form relatively large sized target bodies without the need for subsequent thermomechanical processing or other secondary processing steps for manipulating crystallographic texture.

In still yet another aspect, the present teachings pertain to improved powders for use in preparing consolidated bodies.

For instance the powders may be metal powders, such as refractory metal powders, and alloys of the same. The powders may have an oxygen content that is less than about 75 ppm, and more preferably less than about 60 ppm. For example the oxygen content may range from about 10 to about 50 ppm. The powders may have a content of impurity or other metals having a higher affinity for oxygen (e.g., under the processing conditions herein) than any refractory metal powder of less than about 15 ppm, less than about 10 ppm or even less than about 5 ppm. For example, the teachings illustrate a method that may be employed for realizing oxygen content below about 150 ppm (e.g., below about 125 ppm, below about 100 ppm, or even below about 75 ppm or 60 ppm), such as from about 1 to about 150 ppm, about 1 to about 125 ppm, about 3 to about 75 ppm, or even about 5 to about 60 ppm (e.g., about 10 to about 50 ppm); and/or a magnesium (or other scavenging metal) content below about 15 ppm, below about 10 ppm (e.g., below about 5 ppm), such as about 0.3 to about 15 ppm, about 0.5 to about 10 ppm, or even about 1 to about 5 ppm. The powders may have a particle size distribution that approximates that of Table 1 herein (e.g., within about 10, 20 or 30% of the values stated). For instance, before consolidation, the powders may have a particle size that is below about 250 µm, and approximately 75% by weight of the total particles may have a particle size that is between about 90 to about 250 µm. For example, before consolidation, at least one mass of refractory metal powder may be employed, and the powders may have at least about 95% by weight of particles exhibiting a particle size from about 45 to about 250 µm (for instance, about 29 to about 56 percent (e.g., about 35 to about 47 percent) by weight of the particles in the at least one mass of metal powder may have a particle size that is larger than 150 microns).

The present teachings provide various unexpected benefits. By way of example, by not physically blending a mass of scavenging metal (e.g., in the form of places or other particulates) with a mass of refractory metal (e.g., refractory metal powder) for reducing oxygen in the mass of refractory metal, surprisingly lower amounts (e.g., at least 30%, 40%, 50%, 60% or lower) of scavenging metal in the resulting treated refractory metal are possible without compromising oxygen content reduction, as compared with a mass of scavenging metal that has been blended with the mass of refractory metal. This is potentially critical in instances when high purity refractory metal (e.g., 99.995% purity) is needed. Further, among the advantages and benefits of the present teachings is that, compared with prior techniques, the present teachings afford comparable or better reduction of oxygen contents in the mass of refractory metal at lower temperatures, over shorter reaction times, or both. This is particularly important for increasing throughput, as well as for reducing energy consumption for reactor operations.

DESCRIPTION OF THE DRAWINGS

FIGS. 2A1, 2A2, and 2A3 are illustrative plots to demonstrate the distribution of <100>, <110>, and <111> orientations, respectively. FIGS. 2A1, 2A2 and 2A3 also demonstrate the determination of texture gradients (s100, s110, and s111, respectively) and banding factors (B100, B110, and B111, respectively) for the sputtering target structure depicted in a portion of the grain map of FIG. 1A.

FIGS. 2B1, 2B2, and 2B3 are illustrative plots to demonstrate the distribution of <100>, <110>, and <111> orientations, respectively. FIGS. 2B1, 2B2 and 2B3 also demonstrate the determination of texture gradients (s100, s110, and s111, respectively) and banding factors (B100, B110, and B111, respectively) for the sputtering target structure depicted in another portion of the grain map of FIG. 1A.

DETAILED DESCRIPTION

Figure 1A:
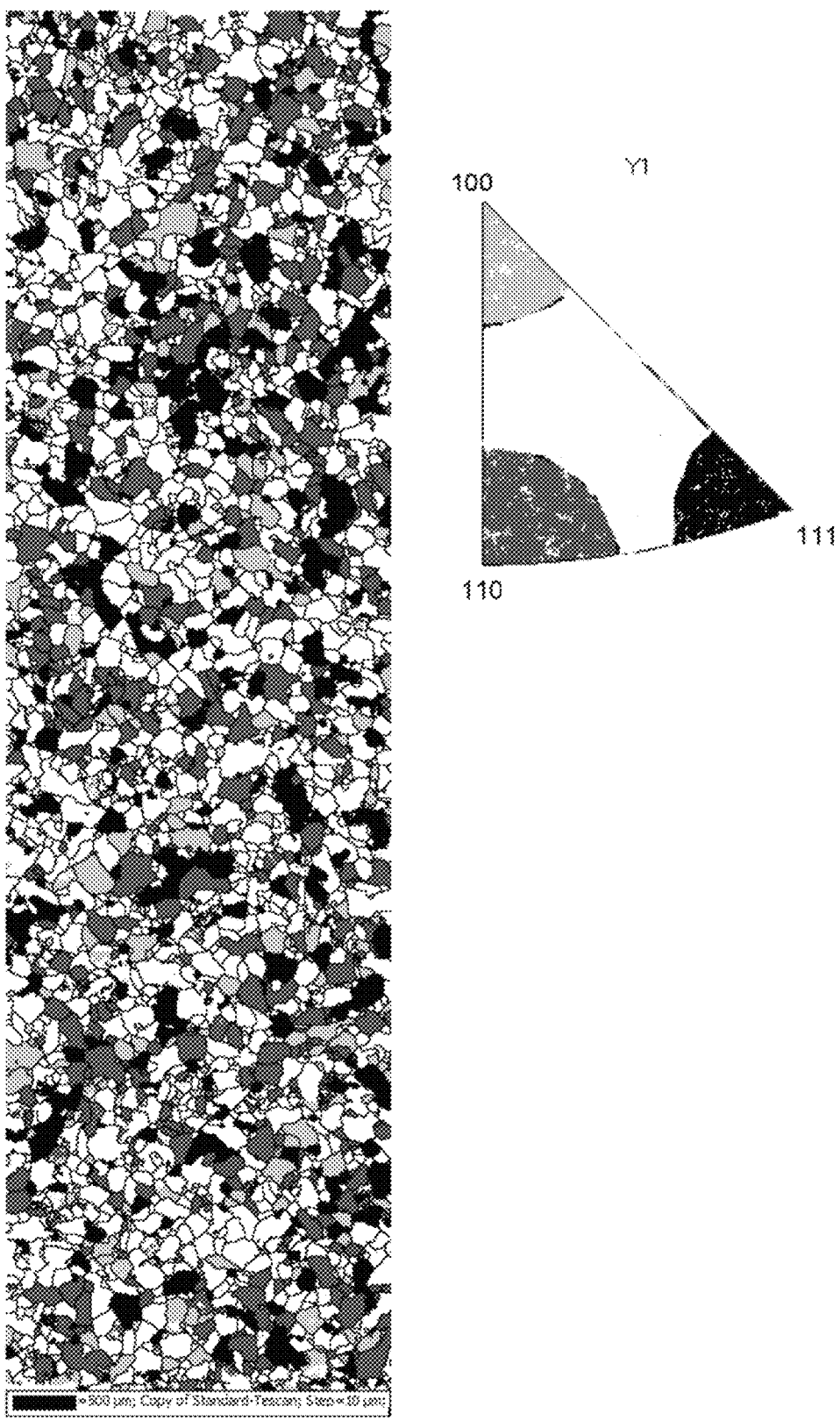
FIG. 1A is an illustrative grain map of a sputtering target body expected to be produced in accordance with the present teachings.

Turning now in more detail to particular teachings of the present invention, in general, the present teachings envision a sputtering target, and particularly a sputtering target structure consolidated from metal powder, such as a refractory metal powder (e.g., tantalum and/or niobium). The target generally will include a target body (namely, the consolidated portion of the target, and specifically the portion of the overall target assembly that is subjected to bombardment for purposes of material removal and sputter deposition). The sputtering target body may be any suitable geometry. It may be generally circular (so that it would have a diameter as its largest dimension). It may be rectangular, and thus have one of its side edges as having its largest dimension (e.g., the length of the side edge). It may be tubular. Though the teachings herein also apply to smaller sputtering targets, they have particular utility for larger scale targets. By way of example, larger scale target bodies may be sized such that they are capable of sputtering generally uniformly onto a wafer or other substrate having a diameter or largest dimension of at least about 200 mm, at least about 300 mm or even at least about 450 mm. Examples of such target bodies may be generally circular or rectangular plate structures having a diameter (or largest dimension) that exceeds about 0.2 meters, about 0.3 meters, or even about 0.4 meters. Such target bodies may be generally circular structures having a diameter that is less than about 1 meter, less than about 0.8 meter, or even less than about 0.6 meter. Target bodies may be as thin as about 1 cm. However, it is possible that the target bodies may be at least about 1.5 cm thick. For example, they may be about 2 cm, 3 cm, 4 cm or even 5 cm in thickness (e.g., they may be in the range of greater than about 1.5 to about 10 cm or about 2 to about 8 cm thick (such as about 2 to about 5 cm thick)).

The target body optionally may include at least two consolidated preformed blocks that are joined together to define the resulting target body.

More particularly, the target body of the teachings herein may be made by consolidating powdered metal (e.g., one or more powdered refractory metals, such as high purity tantalum powder). The consolidation may occur from sintering, hot isostatic pressing, hot extruding, or otherwise densifying at elevated temperature and possibly elevated pressure as well. There may be one or more additional steps of consolidating (which may be at an elevated pressure but at or near room temperature, or at a temperature lower than the temperature of any hot isostatic pressing, hot extruding and/or sintering). For example, there may be a relatively low temperature compacting step (e.g., cold isostatic pressing, rolling, die compacting or any combination thereof). Spraying, such as by cold spray techniques are also possible, such as described in U.S. Pat. No. 8,226,741 and published U.S. Patent Application No. 20080078268, incorporated by reference. For example, cold spraying is a process by which particulated (e.g., powder) materials are deposited as a solid onto a substrate without melting. During this cold spray process, particles are typically heated by a carrier gas (e.g., to only about a few hundred degrees Celsius), and are sprayed (e.g., through a nozzle) so that they travel at a supersonic velocity, such as in the range of 500 to 1500 meters per second, prior to impact with a substrate. Other approaches for consolidation may be employed as well, such as those otherwise disclosed in U.S. Pat. No. 6,521,173 in columns 5 and 6 (incorporated by reference). One approach may be to first compact to a predetermined density that is less than the theoretical density of the material. This may be done, for example, by cold isostatically pressing or otherwise compacting a mass of powders of the desired composition. The resulting mass of powders may be further densified such as by hot isostatically pressing.

If a multiblock assembly is employed, two or more of the resulting consolidated masses may be joined together to form a target body by hot isostatically pressing two or more blocks (e.g., while encapsulated in a suitable hot isostatic pressing container). The two or more blocks may be joined together in the presence or the absence of any powder, foil, tile or other added material within the space between adjoining blocks.

It is contemplated that the starting powdered metals, before consolidation, will include one or more powders of a substantially pure metal (e.g., having a purity (defined to mean free of metallic elements) of at least about 99.5%, 99.95% or even 99.995% purity)).

The powders may have a particle size that is below about 1000 µm, about 850 µm, about 650 µm, about 500 µm, about 350 µm or even about 250 µm (e.g., no particles in the powder exceed about 1000 µm, about 850 µm, about 650 µm, about 500 µm, about 350 µm, or even about 250 µm). For instance, about 95 percent, about 85 percent, about 75 percent by weight of the total particles may have a particle size that is at least about 10 µm, at least about 40 µm, at least about 65 µm, at least about 90 µm or at least about 150 µm. About 95 percent, about 85 percent, about 75 percent by weight of the total particles may have a particle size that is below about 1000 µm, below about 850 µm, below about 650 µm, below about 500 µm, below about 350 µm or below about 250 µm.

About 25 to about 65 percent (e.g., about 29 to about 56 percent or even about 35 to about 47 percent) by weight of the particles in the at least one mass of metal powder may have a particle size that is larger than about 65 µm, about 150 µm, about 250 µm, about 500 µm, about 650 µm or about 850 µm, but below about 1000 µm. It has been surprisingly found that the use of at least about 10, 20, 30, 40 or even 50 percent by weight of particles having a particle size greater than about 150 µm results in an effectively consolidated mass (e.g., as a result of hot isostatic pressing).

About 25 to about 65 percent (e.g., about 29 to about 56 percent or even about 35 to about 47 percent) by weight of the particles in the at least one mass of metal powder may have a particle size that is below about 1000 µm, 850 µm, 650 µm, about 500 µm, about 350 µm, or about 250 µm, but above about 10 µm.

By way of illustration, without limitation, powder particles may have a distribution that approximates that of the following Table 1, with a contemplated variation of about 10%, 20% or 30% of the stated amounts. The amounts set forth in the "average" column refer to approximate percentages by weight of the overall powder mixture.

TABLE 1

| Screen size | Size (µm) | AVERAGE |
| --- | --- | --- |
| Plus60 Mesh | <250 | 0 |
| Plus80 Mesh | 250 > x > 180 | 23.6 |
| Plus100 Mesh | 180 > x > 150 | 19.9 |
| Plus120 Mesh | 150 > x > 125 | 13.2 |
| Plus170 Mesh | 125 > x > 90 | 18.3 |
| Plus200 Mesh | 90 > x > 75 | 6.4 |
| Plus230 Mesh | 75 > x > 63 | 5.8 |
| Plus325 Mesh | 63 > x > 45 | 6.2 |
| Plus400 Mesh | 45 > x > 38 | 3.0 |
| Minus400 Mesh | <38 | 4.1 |

The powders, before consolidation will typically have a particle size that is below about 250 µm, and approximately 75% by weight of the total particles will have a particle size that is between about 90 to about 250 µm. It is contemplated that the resulting grain sizes and grain size distribution within a consolidated article made using the above powder particles may be approximately the same as the particle size of the particles before consolidation (e.g., within about 20%, or even within about 10%).

As can be seen, though powders herein may have a particle size that is not beyond 250 µm, it has been surprisingly found that the use of at least about 10, 20, 30, 40 or even 50 percent by weight of particles having a particle size greater than about 150 µm results in an effectively consolidated mass (e.g., as a result of hot isostatic pressing), and resulting effective sputtering target having an essentially random theoretical texture may be possible as well. For instance, it has been surprisingly found that the use of about 15 to about 30 percent (e.g., about 20 to about 25 percent) by weight of particles having a particle size of between about 180 and about 250 microns still results in an effectively consolidated mass (e.g., as a result of hot isostatic pressing) and resulting effective sputtering target having an essentially random theoretical texture. Moreover, it also has been surprisingly found that similar effective results are possible with the use of about 14 to about 26 percent (e.g., about 17 to about 22 percent) by weight of particles having a particle size of between about 150 and about 180 microns. Thus, with reference to Table 1 (by way of example) the starting materials may include at least from about 29 to about 56 percent (e.g., about 35 to about 47 percent) by weight of powders that have a particle size that is larger than 150 microns but below about 250 µm. Thus, it is thus unnecessary to employ as the starting materials a powder mass that employs a mass of powders with a particle size only below 150 microns for effective consolidation.

The powders, before consolidation preferably will have an oxygen content that is less than about 75 ppm, and more preferably less than about 60 ppm. For example, the teachings illustrate a method that may be employed for realizing oxygen content below about 150 ppm (e.g., below about 125 ppm, below about 100 ppm, or even below about 75 ppm or 60 ppm), such as from about 1 to about 150 ppm, about 1 to about 125 ppm, about 3 to about 75 ppm, or even about 5 to about 60 ppm (e.g., about 10 to about 50 ppm). The powders may be generally spherical. The powders may be non-spherical, such as in accordance with the teachings of U.S.

Pat. No. 6,521,173 (incorporated by reference). The powders may be prepared according to the teachings of U.S. Pat. No. 6,521,173 (incorporated by reference; see, e.g., Examples 1-3) and U.S. Pat. No. 6,261,337 (incorporated by reference), with additional measures taken to assure that the oxygen and magnesium (or other impurity metal) content is below the desired limits. For example, to obtain magnesium (or other impurity metal) below about 15 ppm or even below about 10 ppm, the teachings of U.S. Pat. No. 6,261,337 may be followed generally, however, with a temperature for de-oxidation of the powders not exceeding about 1050° C., 900° C. or even 850° C. (e.g., the temperature to which a metal hydride (e.g., tantalum hydride) material is subjected for forming powders may be capped at a temperature below about 1050° C., 900° C., or even below 850° C., for sufficient amount of time (e.g., about 0.25 to about 4 hours, about 0.5 to about 2 hours, or otherwise) for achieving de-oxidation of the powders). Other steps may be employed as well in variation from those of U.S. Pat. No. 6,261,337, while still yielding surprising and unexpectedly high purities. For example, as will be seen from the following, it has been unexpectedly discovered that relatively low oxygen contents can be achieved, and/or a resulting low content of a scavenging metal (e.g., magnesium) can be achieved by avoiding any step of intimately mixing the scavenging metal and the starting refractory metal powder. The use of lower temperatures and/or shorter processing times at elevated temperature than those in U.S. Pat. No. 6,261,337 may also be employed to yield surprisingly good results.

In more detail, the achievement of relatively low oxygen content and relatively low scavenging metal (e.g., magnesium or other metal having a higher affinity for oxygen than tantalum or another refractory metal being prepared under the specified reaction conditions, such as one or more alkaline earth metals such as calcium, silicon, aluminum, or any combination thereof) can be achieved by a method that involves heating a mass of tantalum (or other refractory metal) powder in the presence of a scavenging metal such as magnesium, or another metal having a higher affinity for oxygen than the refractory metal powder at the processing conditions. The heating is performed in the absence of any prior intermixing of the refractory metal powder and the scavenging metal. That is, the starting materials of one or more masses of refractory metal powder and one or more masses of the scavenging metal may be physically separated (e.g., located in spatially separated receptacles). The heating may be performed in a reactor containing a generally inert atmosphere (e.g., at or above atmospheric pressure, such as about 850 to about 870 torr, to help reduce the possibility of oxygen entering the reactor) and/or under a vacuum. The heating may be at one or more temperatures (and/or temperature and pressure combinations) at which the scavenging metal (i.e., the metal having a higher affinity for oxygen than the refractory metal powder (e.g., one or more alkaline earth metals such as magnesium or calcium, silicon, aluminum, or any combination thereof)) at least partially vaporizes, but below the melting and vaporization temperatures of the refractory metal powder. The resulting vapor of the scavenging metal is transported into the one or more masses of the refractory metal powder and reacts with oxygen present in the refractory metal powder to form a scavenging metal oxide reaction product. The resulting reaction product is thereafter separated from the refractory metal powder. For example, it may be physically (e.g., isolating reaction product that may have deposited or formed at one or more locations within the reactor) and/or chemically (e.g., by leaching with an acid that generally is inert relative to tantalum but that will selectively remove the resulting scavenging metal oxide) separated.

The following is an example of a reaction that can be employed for realizing relatively low oxygen and low magnesium (or other scavenging metal) content tantalum powder. The teachings apply generally as well for other refractory metal processing, and for other scavenging metals as described herein. For example, the teachings illustrate a method that may be employed for realizing oxygen content in a refractory metal (e.g., tantalum) below about 150 ppm (e.g., below about 125 ppm, below about 100 ppm, or even below about 75 ppm or 60 ppm), such as from about 1 to about 150 ppm, about 1 to about 125 ppm, about 3 to about 75 ppm, or even about 5 to about 60 ppm (e.g., about 10 to about 50 ppm); and/or a magnesium (or other scavenging metal) content below about 15 ppm, below about 10 ppm (e.g., below about 5 ppm), such as about 0.3 to about 15 ppm, about 0.5 to about 10 ppm, or even about 1 to about 5 ppm. The teachings illustrate a method that can be employed to reduce the final content of oxygen by weight in a refractory metal (e.g., tantalum), to an amount that is below about 50%, 40%, 30%, or even about 20% of an initial content of oxygen by weight in the refractory metal.

A predetermined amount of refractory metal powder to be treated (e.g., tantalum or other refractory metal powder having a particle size distribution within about 10%, 20% or 30% of that of Table 1) is placed in one or more first receptacles, e.g., a plurality of stacked trays that are open at the top, and which may be supportably spaced from one another by a distance of about 0.3 to about 5 cm, about 0.5 to about 2.5 cm, or even about 1 cm. The receptacles preferably allow for a bed of tantalum powder to be supportively held within the receptacle for exposure to vapor from the scavenging metal (e.g., magnesium vapor). For example, the bed of powder may have a depth ranging from about 0.3 cm to about 3.5 cm, or about 0.5 cm to about 2.5 cm. The refractory metal (e.g., tantalum) powder at the outset may have an initial oxygen content. For example, it may have approximately 300 to 800 ppm (by weight) of oxygen in it.

A predetermined amount of scavenging metal (e.g., magnesium) particulates (e.g., flakes) are placed in one or more second receptacles. The particulates (e.g., flakes) are sufficiently sized so that under reaction conditions they will substantially entirely vaporize. For example, they may have a particle size that about 70 to about 95 (e.g., about 80) parts by weight pass a United States standard sieve size of 20, and about 5 to about 30 (e.g., about 15) parts by weight pass a United States standard sieve size of 30, and less than about 10 (e.g., about 5) parts by weight pass a United States standard sieve size of 40.

The receptacle preferably allows for a bed of scavenging metal particulates (e.g., flakes) to be held within the receptacle. For example, the bed of particulates may have a depth ranging from about 0.3 cm to about 3.5 cm, or about 0.5 cm to about 2.5 cm. The tantalum powder and the magnesium particulates are not blended in contact with each other. Rather, they are physically separated. They only come into contact with each other by way of vapor transport (e.g., via transport of the magnesium or other scavenging metal vapor). By way of example, the amount by weight of refractory metal (e.g., tantalum) powder relative to the amount of scavenging metal (e.g., magnesium) particulates may range from about 700:1 to about 50:1, such as about 500:1 to about 100:1, or even about 400:1 to about 200:1 (e.g., about 333:1).

For each of the refractory metal (e.g., tantalum) powder and the scavenging metal (e.g., magnesium) particulates, there may be a bed of powder or particulates having a predetermined depth in the respective receptacles (e.g., the bed may range from about 0.3 cm to about 3.5 cm, or about 0.5 cm to about 2.5 cm).

The one or more first and the second receptacles with the refractory metal powder and the scavenging metal particulates are positioned in a reactor and the reactor is filled with a generally inert fluid (e.g., argon gas), which fluid is maintained in or flowed through the reactor throughout the duration of the reaction. A pressure within the reactor may be maintained above atmospheric pressure.

By way of illustration, the temperature within the reactor may be elevated to a sufficiently high temperature (e.g., about 750 to about 1100° C., about 800 to about 1000° C., about 850 to about 950° C., or even about 900° C.), for a sufficient amount of time (e.g., about 15 to about 240 minutes, about 30 to about 120 minutes, or even about one hour) so that the scavenging metal (e.g., magnesium flakes) at least partially vaporizes, and the resulting vapor reacts with at least some of the oxygen present in the refractory metal (e.g., tantalum) powder, with a resulting oxide forming with the scavenging metal (e.g., magnesium) and condensing in a cooler region of the reactor (e.g., near the top of the reactor), where it may be separated from the refractory metal (e.g., tantalum) powder that is treated.

A portion of the oxygen originally present in the refractory metal (e.g., tantalum) powder in turn may form a thin oxide layer over at least a portion of the refractory metal (e.g., tantalum) powder. Moreover, it is expected that a slight amount of the scavenging metal (e.g., magnesium) may diffuse into the tantalum powder as well.

Though the present teachings make use of a unique combination of steps that generally avoids intimate mixing of starting powders of the refractory metal and the scavenging metal, it is possible that there may be a step in which in addition to a spaced apart source of scavenging metal, there is employed an amount of a mixture of the scavenging metal and the refractory metal starting materials. For example, there may be one or more discrete zones (e.g., within a reactor, such as within one or more beds) where there is a mixture, and one or more discrete zones having no mixture.

Upon conclusion of the reaction conditions pursuant to which the refractory metal (e.g., tantalum) is reduced by the formation of the scavenging metal oxide, there may be one or more steps for controllably re-introducing oxygen into the resulting mass of refractory metal (e.g., tantalum) powder. That is, one or more passivation steps may be employed for controllably introducing oxygen into the reactor, for forming a thin oxide layer over at least a portion of the refractory metal powder, after the reactor has cooled to a sufficiently low temperature (e.g., below about 60° C., and more preferably to about room temperature). By way of example, such cycles may employ one or more steps of pumping down the reactor to a reduced pressure (e.g., to at or near vacuum conditions), adding argon (or another inert gas) to a desired level, and adding air (or another source of oxygen) in increments with a hold between each air addition. The sequence of successive air additions and holds is repeated until air at or about atmospheric pressure is attained. The system may then be pumped down again to at or near vacuum conditions, and a sequence of successive air additions and holds repeated. This can be repeated multiple times (e.g., two or more additional times). Overall, the passivation cycles may take about four hours.

After any passivation step is employed, the refractory metal (e.g., tantalum) powder and any scavenging metal oxide (e.g., magnesium oxide) may be subjected to a separation step for isolating the tantalum powder. For example, they may be physically separated (e.g., by removal of scavenging metal oxide deposits within the reactor, and/or subjecting to a suitable acid leaching step by which the scavenging metal oxide is removed from the resulting refractory metal (e.g., tantalum)).

As can be seen, surprising results are obtained in contrast with the teachings of U.S. Pat. No. 6,261,337. Relatively low magnesium and oxygen contents in the resulting tantalum powder are possible at lower reaction temperatures and for shorter durations. Moreover, such results are attainable without the need to intimately mix magnesium and tantalum.

As indicated, the above teachings, though illustrated in connection with magnesium, are not intended to be limited to magnesium. Other metals can be employed as well, such as other metals that are capable of vaporizing below the melting point of tantalum, and have a higher affinity for oxygen than does tantalum under the reaction conditions. Moreover, this process has application for other refractory metals (e.g., niobium), wherein the teachings substitute such other refractory metal for tantalum.

Turning now to the use of powders made in accordance with the present teachings, prior to consolidation, if two or more different powders are employed, they may be blended in accordance with art disclosed powder blending techniques. For example, mixing may occur by placing different powders in a dry container and rotating the container about its central axis. Mixing may be continued for a period of time sufficient to result in a completely blended and uniformly distributed powder. A ball mill or similar apparatus (e.g., rotating cylindrical, rotating cone, double cone, twin shell, double planetary, and/or sigma-blade blender) may also be used to accomplish the blending step.

The composition in the resulting target body of the present teachings may generally include tantalum and any additional optional alloying element. For example, the composition may include an alloy including tantalum in an amount so that in the resulting target body there is a substantially pure phase of tantalum in an amount greater than about 70 vol %, greater than about 80 vol %, or even greater than about 90 vol % of the resulting target body.

The at least one additional alloying element may be a metallic element, such as niobium. Nb may be used in lieu of tantalum. It is possible that the teachings herein may find application for other refractory metals.

Broadly stated, the methods herein arise from the surprising recognition that thermomechanical processing and/or post hot isostatic pressing heat treating can be avoided and still result in a target structure that has a random crystallographic texture that is generally uniform throughout the target structure. For instance the target body may be substantially devoid of crystallographic textural banding (i.e., it has a banding factor below about 7% for the <100> and <111> orientations). The target body may be substantially devoid of crystallographic texture gradients (i.e., it has an average through-thickness gradient that has an absolute value below about 6%/mm for the <100> and <111> orientations). For example it may have an average through-thickness gradient that has an absolute value below about 5%/mm, 4%/mm, 3%/mm, 2%/mm or even 1%/mm. The ratio of crystallographic textures by volume of <100>, <110> and <111> throughout the resulting sputtering target body may be about 1:2:1.4.

Typically the manufacture of the target bodies herein will employ a powder starting material, such as one having the previously described particle sizes. The powder may be densified by the application for a desired period of time of heat, pressure or both. For example, they may be compacted, sintered, cold isostatically pressed, hot isostatically pressed or any combination thereof. An initial compaction step may occur. For example, an initial step may be employed to compact a mass of powder to about 50 to about 85% of theoretical density (e.g., about 60 to about 70% of theoretical density). This may be done by a suitable cold isostatic pressing operation. One or more secondary operations may also be performed, such as a cold working step, a hot working step, an annealing step, or otherwise. However, advantageously, the teachings herein could make it possible to obviate such secondary operations, and it is thus contemplated that such secondary operations are not employed. It is believed that one surprising result of the present teachings is the ability to process target bodies to near full theoretical density (e.g., about 98% of theoretical) without any defects that would cause sputtering problems, in the absence (for instance) of any intermediate secondary operation, such as a step of cold working after pressing.

A preferred approach to consolidation includes a step of encapsulating a mass of the powders of the present teachings in a container (e.g., hermetically sealing the mass in a container such as a hot isostatic pressing can), and then hot isostatically pressing (HIP) the mass (e.g., an uncompacted powder mass or a compacted powder mass (e.g., from a prior cold isostatic press operation, or other compacting operation)).

Hot isostatic pressing in accordance with the present teachings preferably takes place at a pressure of about 100 to about 300 MPa, about 170 MPa to about 250 MPa, and more preferably about 190 to about 220 MPa (e.g., about 200 MPa). The HIP process desirably may be performed at a temperature that is at or below about 1400° C., about 1325° C., or about 1250° C. It is possible that pressing may be at lower temperatures (e.g., below about 1100° C. (e.g., less than about 1080° C. or even less than about 1000*C)). For example, the HIP process may take place at a temperature of about 950° C. to about 1400° C.

The HIP process may range in duration from about 1 to about 12 hours, and more preferably about 4 to about 10 hours (e.g., about 6 hours).

By way of example, without limitation, the mass may be pressed to form a disk-shaped body that will be subject to bombardment. The mass may be pressed to form a rectangular or other shaped body that will be subject to bombardment. The size of the resulting shaped body that will be subject to bombardment desirably will be sufficiently large that it will suffice to sputter thin films of generally uniform thickness across the entirety of a wafer or other substrate that has a diameter of at least about 200 mm, 300 mm, or even at least about 450 mm or larger.

Following the step of hot isostatic pressing there may be one or more steps of machining and/or surface finishing of the pressed body to its final state. For example, surface material may be removed by grinding and/or polishing. One or more structural features may be machined as well (e.g., one or more features for fixturing, for receiving an O-ring in a backing plate for high vacuum applications, or otherwise). The teachings herein also contemplate that a backing plate may be attached to the target body.

In yet another aspect of the teachings herein, it is contemplated that sputtering is performed using a sputtering target in accordance with the present teachings to generate a thin film having a substantially uniform thickness (and preferably also having substantially uniform material properties) across substantially the entirety of a substrate region for which a sputter deposit is sought. It also is contemplated that thin films result that are used in any of a number of electronic component or devices (e.g., as a layer, such as a barrier layer, an electrode layer, as part of a semiconductor, as part of an integrated circuit or otherwise), such as one or more of television, a video display, a smartphone, a tablet computer, a personal digital assistant, a navigation device, a sensor, a photovoltaic device, or a portable entertainment device (e.g., video players, music players, etc.).

The thin films may be substantially devoid of any structural artifacts attributable to textural banding or crystallographic texture gradients. The thin films may exhibit a generally constant film thickness (sputtering conditions being equal) throughout the entirety of the thickness of the target body (e.g., a variation of film thickness from the top of the target through to the bottom of the target being less than about 10% or even 5%). The thin films may have a thickness of less than about 350 nm, less than about 225 nm, or even less than about 100 nm. The thin films may have a thickness of greater than about 5 nm, or even greater than about 10 nm. For example, the films may have a thickness of about 15 to about 25 nm. The variation of a thickness within a single film may be less than about 20%, less than about 10% or even less than about 5% of an average film thickness for such film.

Sputtering using the target bodies herein may include one or more steps of sputtering to depths that are substantially the entire thickness of the target body (e.g., to a depth that is at least 80%, 90%, or even 95% the thickness of the target body).

The microstructure of resulting target bodies preferably is substantially uniform throughout the body. In a typical target body that includes tantalum and at least one other element, the microstructure preferably exhibits a matrix of pure tantalum, with regions of the other element distributed substantially uniformly throughout the matrix. Regions of the other element phase may be generally equiaxed. Regions of the other element phase may vary in size substantially uniformly throughout the target body or target.

As the person skilled in the art will appreciate, the present teachings contemplate one or more of the following characteristics and/or variations. The methods herein may include or may be free of any step of forming a cast metal ingot that is thereafter thermomechanically processed for forming a target. The methods herein may include or may be free of any step of annealing or other heat treating. The methods herein may include or be free of any step of asymmetric rolling, such as in accordance with the teachings of U.S. Pat. No. 8,250,895, hereby incorporated by reference. The methods herein may be free of any step of electron beam melt ingot formation. The methods herein may be free of any step of forging (e.g., side forging, upset forging or otherwise). The methods may be free of any step of plasma treatment or other plasma processing of any powders.

The bodies of targets herein may have a grain size ranging from about 15 to about 500, about 350, about 250, or about 150 μm throughout the target (e.g., at least throughout the portion of the target that is subjected to bombardment for sputtering). Desirably the grain size will average throughout the target body in the range of about 30 to about 145 μm, more preferably about 35 to about 135 μm, and still more preferably about 40 to about 125 μm, or even about 55 to about 115 μm, about 65 to about 105 μm, or about 75 to about 100 μm. It is thus possible that the average grain size may be in excess of about 65 μm (e.g., it may be about 70 μm, about 80 μm, about 90 μm, or even about 100 μm). Such average grain size may be realized substantially throughout the entirety of the target body. Such average grain size and grain size distribution may be substantially uniform throughout the entirety of the target. A major portion of the grains may be generally equiaxed. For example, at least about 60%, 70% or more by volume of the grains may be generally equiaxed.

As noted elsewhere, the target bodies made in accordance with the present teachings are contemplated to exhibit a substantially uniform crystallographic texture throughout, with randomly disposed <100>, <110> and <111> crystallographic texture components, and are expected to be generally free of any crystallographic texture bands, crystallographic texture gradients, or both. The crystallographic texture of the resulting sputtering target body may be about 9-11% by volume <100>, about 20-23% by volume <110> and about 13-16% by volume <111>. The ratio of crystallographic textures by volume of <100>, <110> and <111> throughout the resulting sputtering target body ranges from about 5-15:15-30:10-25 (e.g., about 7-13:17-26:11-20, such as about 9-11:20-23:13-16). The ratio of crystallographic textures by volume of <100>, <110> and <111> throughout the resulting sputtering target body thus may be about 1:2:1.4. As seen, the resulting crystallographic texture is essentially near perfectly random theoretical texture.

The teachings herein thus contemplate a refractory metal plate (or other target structure) having a center, a thickness, an edge, a top surface and a bottom surface, the refractory metal plate (or other target structure) having a crystallographic texture (as characterized by through thickness gradient, and variation across the plate), for each of the crystallographic texture components <100> and <111> which is substantially uniform throughout the plate.

The target body may have a crystallographic texture as characterized by a through thickness gradient (s), and/or an average variation across the target body (or "banding factor ("B")), for the crystallographic texture components <100>, <110>, and <111>, where the absolute value of the average through-thickness gradient is less than or equal to 6%, 5% or 4%, 3%, 2% or even 1% per mm, and/or the average variation across the target body (B) is less than or equal to 8%, 7%, 6%, 5% or 4%, 3%, 2% or even 1%.

The target body may have a crystallographic texture as characterized by through-thickness gradient; and maximum variation across the body, for the crystallographic texture components <100> and <111>, where the maximum through-thickness gradient is less than or equal to the absolute value of 13% per mm, 9% per mm, 5% per mm, or even 3% per mm; and/or the maximum variation of texture across the body is less than or equal to 11%, 9% or even 7%.

Figure 1B:
FIG. 1B is an illustrative grain map of a sputtering target body produced using secondary thermomechanical processing (e.g., rolling) to achieve the resulting crystallographic texture.
Figure 1C:
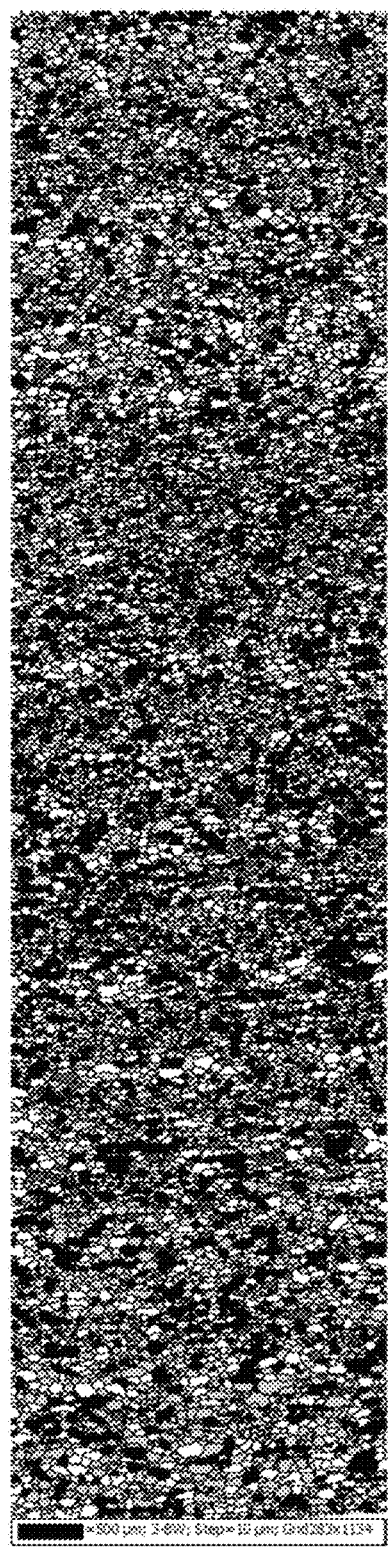
FIG. 1C is an illustrative grain map of a sputtering target body produced using asymmetric rolling in accordance with the teachings of published U.S. Patent Application No. 20090038362.

For the maps of FIGS. 1A-1C, mapping three grain orientations, the maps show the grains which have particular crystallographic directions within 15 degrees of the plate Normal Direction ("ND"; e.g., the vertical direction on the maps). Grains with a <111> orientation within 15 degrees of ND are the darkest shaded grains (typically shown as blue for an EBSD map in accordance with the test method described herein). Grains with a <100> orientation within 15 degrees of ND are the lightest shaded grains (typically shown as red for an EBSD map in accordance with the test method described herein). Grains with a <110> orientation within 15 degrees of ND are the second most dark shaded (i.e., a shade in between the lightest and darkest) grains (typically shown as yellow for an EBSD map in accordance with the test method described herein). Grains which satisfy none of the criteria are white in the figures (typically shown as gray in an EBSD map in accordance with the test method described herein). A key is included with the figures to show the shading and corresponding textures.

With reference to FIG. 1A, there is seen how the teachings herein are expected to achieve a generally uniform and random crystallographic texture that is generally devoid of textural banding, and has a generally uniform grain size and distribution throughout the target body. The average grain size shown therein is about 71 μm. As seen, however, smaller and larger grains are shown and are contemplated as within the general teachings herein. The map of FIG. 1A can be prepared from a sample that may be made according to the following. A mass of tantalum powders may be employed. The powders may be subjected to a technique in accordance with the teachings herein for reducing the oxygen content and having a content of any scavenging metal below about 15 ppm (e.g., below about 10 ppm). A mass of powders can be cold isostatically pressed by applying a suitable pressure (e.g., to an initial state at a pressure of about 220 MPa) to achieve a density ranging from about 82 to about 88% of theoretical density. The cold isostatic pressed powders, while within a container, may be hot isostatically pressed under suitable temperature and pressure conditions and for suitable time (e.g., at a temperature of about 1250 degrees C., a pressure of about 207 MPa for a period of time such as about 6 hours) to achieve a density near theoretical density (e.g., at least 98% of theoretical density). The resulting hot isostatically pressed body is removed from the container and can be processed (e.g., by cutting and/or machining to final dimensions).

Even though this particular illustration is derived from a particular set of materials and parameters, it is expected that generally similar results are obtained when other materials and parameters within the scope of the present teachings are used.

In contrast, the sample of FIG. 1B is a tantalum powder billet that is cold isostatically pressed, then hot isostatically pressed and then subjected to thermomechanical processing (i.e., a series of cross-rolls). Though it has an average grain size of about 48 μm, it can be seen that some textural gradient arises. The sample of FIG. 1C illustrates a crystallographic texture that may be realized in accordance with the teachings of published U.S. Patent Application No. 20090038362, using asymmetric rolling of a slab prepared by ingot metallurgy (i.e., electron beam melted). It has an average grain size of about 54 μm as well. Thus, it is seen from FIG. 1A, that a target derived from powdered metal and that is conducive to sputtering is achievable in the absence of any thermomechanical processing step following consolidation.

With reference to the plots of FIGS. 2A1, 2A2, 2A3, 2B1, 2B2, and 2B3, it can be seen how texture gradients and banding factors can be obtained from the plot of FIG. 1A for at least the <111>, <110>, and <100> orientations.

Figure 3A:
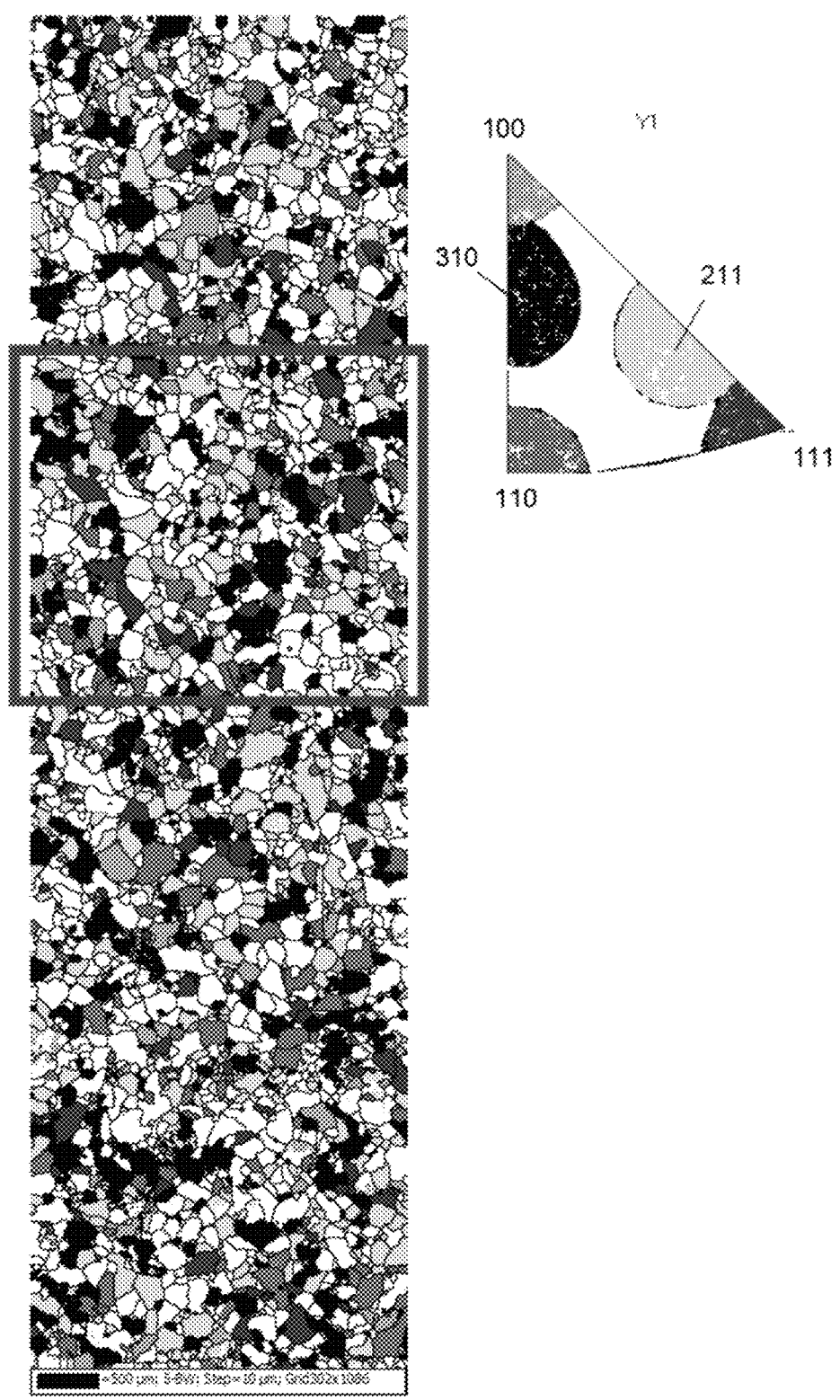
FIG. 3A is an illustrative grain map of the sputtering target body as exhibited in FIG. 1A, but with five grain orientations mapped.
Figure 3B:
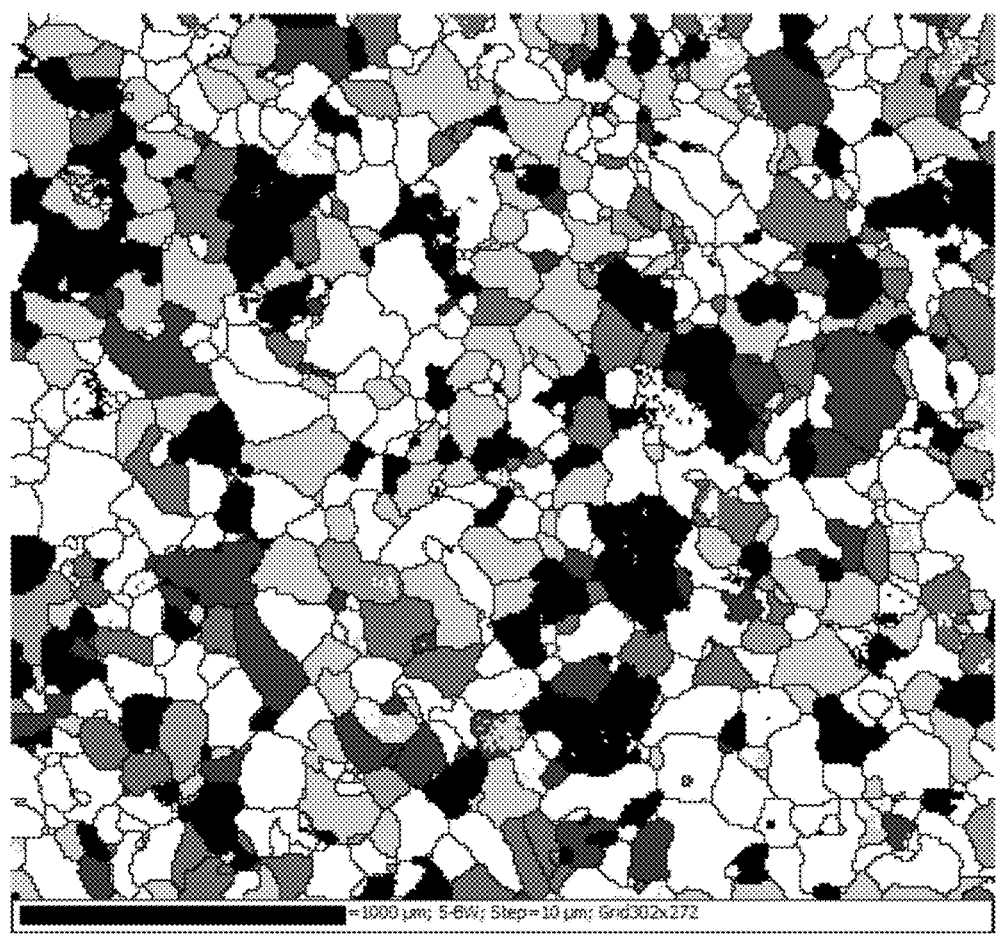
FIG. 3B is an enlarged portion of the area within the rectangle of FIG. 3A.

With reference to FIGS. 3A and 3B, in addition to the <100>, <110> and <111> orientations mapped in FIG. 1A, there is depicted an expected map for the same material, but also including mapping of the expected <211> and <310> orientations. FIG. 3B is an enlarged portion of the area within the rectangle of FIG. 3A. In contrast to the map of FIG. 1A, for purposes of this analysis, and to prevent significant overlap between the groups of orientations, a 10-degree criteria is used instead of the 15-degree criteria described herein for texture analysis. That is, the teachings of published U.S. Application No. 2009/0038362 (e.g., paras. 159-171) can be employed and orientation strengths can be calculated by counting the percentage of grains with an axis of that orientation within 10 degrees of normal to the surface of the sputtering target (y-direction in the EBSD scan). In these figures, the lightest shaded grains correspond with a <211> texture (which may be shown using any color, such as green, for an EBSD map in accordance with the test method described herein). The next lightest (i.e., slightly darker than the lightest shading) shaded grains correspond with a <100> texture (typically shown as red for an EBSD map in accordance with the test method described herein). The slightly darker shaded grains than the two lightest shades (i.e., the "middle" shade) correspond with a <110> texture (typically shown as yellow for an EBSD map in accordance with the test method described herein). The darkest shaded grains correspond with a <310> texture (may be shown using any color, such as pink, for an EBSD map in accordance with the test method described herein). The second darkest shaded grains (i.e., a shade lighter than the darkest shaded grains) correspond with a <111> texture (typically shown as blue for an EBSD map in accordance with the test method described herein). The white areas, or areas with no shading, are grains in the texture maps that are not detectable (e.g., because they are outside of the proper orientation (e.g., outside of about 15° of normal direction ("ND"))). A key is included with the figures to show the shading and corresponding textures.

As can be appreciated from the mapping, it is possible that for sputtering target bodies in accordance with the present teachings, the volume percentage of <110> texture can exceed that of each of <100> and <111> textures. The volume percentage of one or both of <211> and <310> textures can exceed each of <100>, <110> and <111> textures. The total amount of <100>, <110> and <111> textures by volume may be about 0.4 to about 0.6 (e.g., about one half) of the total amount of <211> and <310> textures. The volume amount of <111> texture may be below that of the <310> texture. The volume percentage of <110> texture may be about 0.5 to about 1.5 (e.g., about 0.95 or about 0.96) of the total amount of <100> and <111> textures. The volume percentage of <110> texture may be about 0.1 to about 0.3 (e.g., about 0.2) of the total amount of <110>, <111>, <211> and <310> textures. The volume amount of the <110> texture may be less (e.g., about one half or less) than the volume amount of the <211> texture, the <310> texture, or both. The volume amount of the <111> texture may be less (e.g., about one half or less) than the volume amount of the <211> texture, the <310> texture, or both.

The relative ratio by volume of <211> to <310> textures throughout the resulting sputtering target body may be approximately the same or within about 20 percent of each other. The resulting sputtering target body ratio by volume of <211> to <310> textures throughout the resulting sputtering target body may be about 1.2:1 to about 1:1.2, e.g., about 1.1:1 to about 1:1.1, or even about 1:1. Without limiting the proportions derived above, it is possible that the relative ratio by volume of the five grain orientations (<100>:<110>:<111>:<211>:<310>) may be about 5-15:15-30:10-25:30-45:30-45 (e.g., about 6-12; 16-20:10-15; 33-38; 33-38 or, may have a ratio or of about 3:6:4:12:12 if reducing by a common denominator).

EXAMPLES

Tantalum powder samples are prepared according to the conditions of Table 2. Beds of tantalum powder having a particle size distribution of Table 1 are placed in a reactor in a plurality of stacked and spaced apart trays (e.g., four circular trays that each have a base area of about 4000 cm$^2$, and are spaced from each other by about 1 cm). The reactor has a volume of about one cubic meter. In a separate tray, spaced apart from the stacked trays of tantalum powder, a bed of magnesium flakes is also placed in the reactor. The amount of the magnesium flakes is about 0.3 percent of the weight of the total amount of tantalum in the reactor. The temperature is the temperature at which the reaction takes place. The time is the duration at such temperature. Table 2 provides expected average results for the recited conditions.

TABLE 2

| Run | Ta Bed thickness [cm] | Temperature [C.] | Time [min] | Oxygen (ppm) | Mg (ppm) |
|---|---|---|---|---|---|
| A | 2.54 | 1000 | 120 | 38.5 | 3.837 |
| B | 2.54 | 900 | 60 | 39.5 | 2.891 |
| C | 2.54 | 800 | 30 | 125.75 | 2.319 |
| D | 1.27 | 900 | 30 | 58.5 | 2.397 |
| E | 1.27 | 800 | 120 | 75.25 | 1.259 |
| F | 1.27 | 1000 | 60 | 45 | 4.175 |
| G | 0.64 | 800 | 60 | 39.75 | 2.059 |
| H | 0.64 | 1000 | 30 | 44.5 | 3.105 |
| I | 0.64 | 900 | 120 | 45 | 3.691 |

As seen from the above, relatively low amounts of oxygen and/or magnesium are achievable under varying conditions.

The present teachings also contemplate one or more steps such as cleaning, milling or otherwise machining or surface finishing a target, attaching a backing plate, or otherwise. Though such steps potentially may slightly affect the texture of the as consolidated (e.g., hot isostatically pressed) target at the surface of the target, they are not expected to impart texture modification substantially throughout the target, and thus they are consistent with the teachings herein.

General Remarks

Target thickness refers to the smallest dimension of a three dimensional sputtering target. By way of example, for a target having a plate structure, the plate will have an upper surface and a lower surface each having a length and a width (e.g., if rectangular), or a diameter (if circular), and will have a thickness that is the distance between the upper and lower surfaces.

As used herein, metal purities refer to purity (in weight percent) of the metals in relation to the presence of other metals, not interstitial impurities, that may arise.

Crystallographic texture measurements herein are made in accordance with the teachings of published U.S. Application No. 20090038362, incorporated by reference (see, paras. 159-171). The crystallographic texture of each sample can determined by electron backscatter diffraction (EBSD), using a 15 μm step in both horizontal and vertical directions (a step less than 15 μm is also possible, such as a 10 μm step, or can be chosen or determined based on the grain size, such as a measurement of the grain size (e.g., average grain size) divided by a number such as 3). The orientation strengths are calculated by counting the percentage of grains with an axis of that orientation within 15° of normal to the surface of the sputtering target (y-direction in the EBSD scan).

By way of illustration samples can be taken from the center of the target structure, the mid-radius of the target structure and the edge of the structure, and the texture determined by EBSD, using a 10 μm step in both horizontal and vertical directions.

Grain maps of the full thickness of samples are generated. The maps show the grains which have particular crystallographic directions within 15° of the plate Normal Direction ("ND"; the vertical direction on the maps). When performing EBSD measurements, ND may be aligned with the sputtering direction of the plate. For certain instruments (e.g., software packages that process EBSD data, such as the CHANNEL 5 package), grains with <100> orientation within 15° of normal direction ("ND") may be depicted as red, those with <111> orientation within 15° of ND may be depicted as blue, and those with <110> orientation within 15° of ND may be depicted as yellow. When depicting five grain maps, grains with <211> orientation within 15° of ND may be depicted as any color that is able to be differentiated from the other colors of the map, such as green, and those with <310> orientation within 15° of ND may be depicted as any color that is able to be differentiated from the other colors of the map, such as pink. For these certain instruments, grains which satisfy none of the criteria are typically depicted as grey. The percentages of area occupied by these color blocks form the basis of calculation of the numerical factors addressed below.

The maps are analyzed mathematically by dividing them into two halves, a top half and bottom half. A mask, with a cut-out hole (e.g., 90 µm high), but full-width, is placed over the map, such that the top of the cut-out hole corresponds to the top of the map. The height of the window (e.g., in this case 90 µm) can be chosen to be approximately 3 grains, but an integral number of EBSD steps may be employed (in this case, 9 steps). The percentage of the area of the cut-out hole occupied by red color is calculated, as is the percentage occupied by blue color. The mask is moved down by one step (e.g., 10 µm), and the calculations repeated. This is repeated until the bottom of the cut-out hole corresponds to the bottom of the map. A graph is made showing the results (FIGS. 2A1, 2A2, 2A3 and 2B1, 2B2, and 2B3 illustrate examples of such a graph for the top and bottom halves respectively of the sample depicted in FIG. 1A). The Y axis shows the area percentage, while the X axis shows the position of the mask cut-out, (e.g., from the top or bottom of the map to mid-thickness). The graph could be plotted in color to correspond with the orientation depicted. For example, the red dots could refer to <100>, while the blue dots could refer to <111>, and green dots could refer to <110> orientations. These data points can also be plotted on separate graphs for each orientation (e.g., if color cannot be used to differentiate between the orientations). This data is analyzed to determine, for each half of the thickness: a) The gradient of the best-fit straight line through the <100> data, expressed as % per mm; b) The gradient of the best-fit straight line through the <111> data, expressed as % per mm; c) The average distance (in the y-direction) of each <100> data-point from the best-fit straight line (which, if it would go below zero, is counted as zero), expressed as % (this would correspond to a <100> banding factor) and d) The average distance (in the y-direction) of each <111> data-point from the best-fit straight line (which, if it would go below zero, is counted as zero), expressed as % (this would correspond to a <111> banding factor). To calculate the average gradient, the absolute value of each individual gradient value is used. The data can be analyzed for the <110> orientation in a similar way (e.g., to determine the gradient of the best-fit straight line through the <110> data, expressed as % per mm; and the average distance (in the y-direction) of each <110> data point from the best-fit straight line (which, if it would go below zero, is counted as zero), expressed as % (which would correspond to a <110> banding factor)).

Crystallographic textures are expressed for orientations that are parallel to the normal direction of the target (e.g., for a target body that is a plate, crystallographic texture is expressed for orientations that are parallel to the plate normal direction).

A skilled artisan will appreciate that results are obtainable that are generally consistent with the teachings herein when certain variations to the above methodologies are pursued. By way of example, as illustrated in the figures of Ser. No. 61/978,349, the use of a 20 degree substitution for 15 degrees, and/or use of a 10 micron increment as compared with a 15 micron increment in the above yields a texture map that illustrates similar relative proportions of the different axes, and sufficient information for determining other texture measurements.

Grain size measurements are made according to ASTME112-12.

Unless otherwise stated, powder particle sizes are determined by screen analysis in accordance with ASTM B214-07(2011). Further, unless otherwise stated, particle sizes refer to pre-consolidation sizes.

Determination of oxygen in tantalum powder can be determined in accordance with ASTM E1569-09. Oxygen determination for other metals can also be determined by placing a sample in a graphite crucible, which is inserted into a furnace, and held between electrodes. The furnace is purged with an inert gas (e.g., He or Ar). A sufficiently high current is passed through the crucible to increase temperature to above 2500° C., thereby generating gasses in the furnace from the metal. The resulting gasses are released into a flowing inert gas stream. The gas stream in turn is directed to an infrared detector for measuring oxygen as CO or $CO_2$. Instrument calibration can be performed using known reference materials.

As to all of the foregoing general teachings, as used herein, unless otherwise stated, the teachings envision that any member of a genus (list) may be excluded from the genus; and/or any member of a Markush grouping may be excluded from the grouping. Percentages of the sputtering target expressed herein refer to the material of the sputtering target available for sputter deposition, and do not include other sputter target components, such as backing plates. It should be recognized that backing plates may be separately added to the sputter target bodies herein. Sputtering targets herein may be cylindrical in shape. They may be in the form of plates (e.g., rectangular, circular or otherwise).

Unless otherwise stated, any numerical values recited herein include all values from the lower value to the upper value in increments of one unit provided that there is a separation of at least 2 units between any lower value and any higher value. As an example, if it is stated that the amount of a component, a property, or a value of a process variable such as, for example, temperature, pressure, time and the like is, for example, from 1 to 90, preferably from 20 to 80, more preferably from 30 to 70, it is intended that intermediate range values such as (for example, 15 to 85, 22 to 68, 43 to 51, 30 to 32 etc.) are within the teachings of this specification. Likewise, individual intermediate values are also within the present teachings. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight, and vice versa. Thus, an expression in the Detailed Description of the Invention of a range in terms of at "'x' parts by weight of the resulting polymeric blend composition" also contemplates a teaching of ranges of same recited amount of "x" in percent by weight of the resulting composition. Relative proportions derivable by comparing relative parts or percentages are also within the teachings, even if not expressly recited.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of the elements, ingredients, components or steps. Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups. It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

What is claimed is:

1. A method for making a sputtering target comprising the steps of:
   a. encapsulating at least one mass of metal powder that has at least about 95% by weight of particles exhibiting a particle size ranging from about 10 to about 1000 µm, with at least about 10 percent by weight of particles having a particle size greater than about 150 µm, in a container configured for defining at least a portion of a sputtering target body; and
   b. hot isostatically pressing the at least one mass of metal powder to form a resulting densified mass having an initial crystallographic texture, while the at least one mass of metal powder is in the container, wherein the hot isostatically pressing step is performed under conditions so that the initial crystallographic texture achieved in the resulting densified mass is an essentially theoretically random and generally uniform crystallographic texture, wherein the method is devoid of any step of altering the initial crystallographic texture substantially throughout the resulting densified mass after the step of hot isostatically pressing and prior to sputtering, and
   wherein the method includes a step of making a refractory metal powder using a method comprising the steps of:
   a. locating an initial mass of refractory metal powder having an initial content of oxygen in a reactor;
   b. locating within the reactor, spaced apart from the initial mass of refractory metal powder, a mass of a scavenging metal, wherein the mass of the scavenging metal and the initial mass of refractory metal powder are not blended together;
   c. heating within the reactor to a scavenging temperature for causing at least a portion of the scavenging metal to at least partially vaporize and react with at least a portion of the initial content of oxygen to form a scavenging metal oxide with at least a portion of the scavenging metal; and
   d. separating the scavenging metal oxide from the initial mass of refractory metal powder so that a resulting mass of refractory metal powder is formed that has a resulting content of oxygen that is less than the initial content of oxygen, wherein the at least one mass of metal powder comprises at least a portion of the resulting mass of refractory metal powder, and wherein the resulting densified mass (i) has an oxygen content below about 125 PPM, and/or (ii) comprises the scavenging metal in an amount below about 10 PPM.

2. The method of claim 1, wherein the resulting mass of refractory metal powder comprises at least about 99.95 percent by weight of tantalum.

3. The method of claim 1, wherein the initial content of oxygen is greater than about 300 ppm by weight.

4. The method of claim 1, wherein the initial mass of refractory metal powder is in a bed having a depth ranging from about 0.3 cm to about 3.5 cm.

5. The method of claim 1, wherein the scavenging metal is magnesium, is present in the reactor in the form of flakes, or both.

6. The method of claim 1, wherein the heating step includes heating in the reactor at a temperature of about 800 to about 1000° C. for a time of about 30 minutes to about 2 hours.

7. A method for making a sputtering target comprising the steps of:
   a. making a refractory metal powder using a method comprising the steps of:
      1. locating an initial mass of refractory metal powder having an initial content of oxygen in a reactor,
      2. locating within the reactor, spaced apart from the initial mass of refractory metal powder, a mass of a scavenging metal, wherein the mass of the scavenging metal and the initial mass of refractory metal powder are not blended together,
      3. heating within the reactor to a scavenging temperature for causing at least a portion of the scavenging metal to at least partially vaporize and react with at least a portion of the initial content of oxygen to form a scavenging metal oxide with at least a portion of the scavenging metal, and 4. separating the scavenging metal oxide from the initial mass of refractory metal powder so that a resulting mass of refractory metal powder is formed that has a resulting content of oxygen that is less than the initial content of oxygen;

b. encapsulating the resulting mass of refractory metal powder that has at least about 95% by weight of particles exhibiting a particle size ranging from about 10 to about 1000 µm, with at least about 10 percent by weight of particles having a particle size greater than about 150 µm, in a container configured for defining at least a portion of a sputtering target body; and c. hot isostatically pressing the resulting mass of refractory metal powder to form a resulting densified mass having an initial crystallographic texture, while the resulting mass of refractory metal powder is in the container, wherein the hot isostatically pressing step is performed under conditions so that the initial crystallographic texture achieved in the resulting densified mass is an essentially theoretically random and generally uniform crystallographic texture, wherein the method is devoid of any step of altering the initial crystallographic texture substantially throughout the resulting densified mass after the step of hot isostatically pressing and prior to sputtering.

8. The method of claim 7, wherein the method is free of any further thermomechanical processing step.

* * * * *